United States Patent
Mignot et al.

(10) Patent No.: US 11,916,013 B2
(45) Date of Patent: Feb. 27, 2024

(54) VIA INTERCONNECTS INCLUDING SUPER VIAS

(71) Applicant: International Business Machines Corporation, Armonk, NY (US)

(72) Inventors: Yann Mignot, Slingerlands, NY (US); Christopher J. Waskiewicz, Rexford, NY (US); Eric Miller, Watervliet, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 17/465,815

(22) Filed: Sep. 2, 2021

(65) Prior Publication Data
US 2023/0065078 A1 Mar. 2, 2023

(51) Int. Cl.
*H01L 23/522* (2006.01)
*H01L 23/528* (2006.01)
*H01L 21/768* (2006.01)

(52) U.S. Cl.
CPC .... *H01L 23/5226* (2013.01); *H01L 21/76808* (2013.01); *H01L 21/76816* (2013.01); *H01L 21/76834* (2013.01); *H01L 21/76892* (2013.01); *H01L 21/76897* (2013.01); *H01L 23/5283* (2013.01)

(58) Field of Classification Search
CPC . H01L 23/5226; H01L 23/522; H01L 23/481; H01L 23/485; H01L 21/76829; H01L 21/76831; H01L 21/76832; H01L 21/76834
See application file for complete search history.

(56) References Cited

U.S. PATENT DOCUMENTS

| | | | |
|---|---|---|---|
| 6,521,542 B1 | 2/2003 | Armacost |
| 7,256,502 B2 | 8/2007 | Chung |
| 9,059,257 B2 | 6/2015 | Li |
| 9,385,078 B1 | 7/2016 | Feurprier |
| 9,805,972 B1 | 10/2017 | Zhang et al. |
| 10,020,254 B1 | 7/2018 | Bao et al. |
| 10,354,912 B2 | 7/2019 | Junhao |
| 10,896,874 B2 | 1/2021 | Ning |
| 10,978,388 B2 | 4/2021 | Amanapu |
| 2019/0067091 A1 | 2/2019 | Morrow |

(Continued)

FOREIGN PATENT DOCUMENTS

| | | |
|---|---|---|
| CN | 109920776 A | 6/2019 |
| EP | 192656 | 4/2002 |
| WO | 2017052559 | 3/2017 |

OTHER PUBLICATIONS

Sacrificial Organic metallization—Via Plug, Disclosed Anonymously, IP.com No. IPCOM000254938D IP.com Electronic Publication Date: Aug. 14, 2018, 4 pages.

*Primary Examiner* — Thanhha S Pham
(74) *Attorney, Agent, or Firm* — Samuel Waldbaum; Otterstedt & Kammer PLLC

(57) ABSTRACT

Interconnect structures including super vias are formed during back-end-of-line processing using sacrificial placeholders to protect the bottom portions of the super vias while upper portions of the super vias are formed. The sacrificial placeholders are removed and replaced by metal conductors that fill the bottom and upper portions of the super vias.

5 Claims, 10 Drawing Sheets

(56) References Cited

U.S. PATENT DOCUMENTS

2020/0058585 A1* 2/2020 Xu .................... H01L 21/76816
2020/0388567 A1 12/2020 Mignot
2021/0028106 A1 1/2021 Briggs
2021/0082747 A1 3/2021 Mignot

* cited by examiner

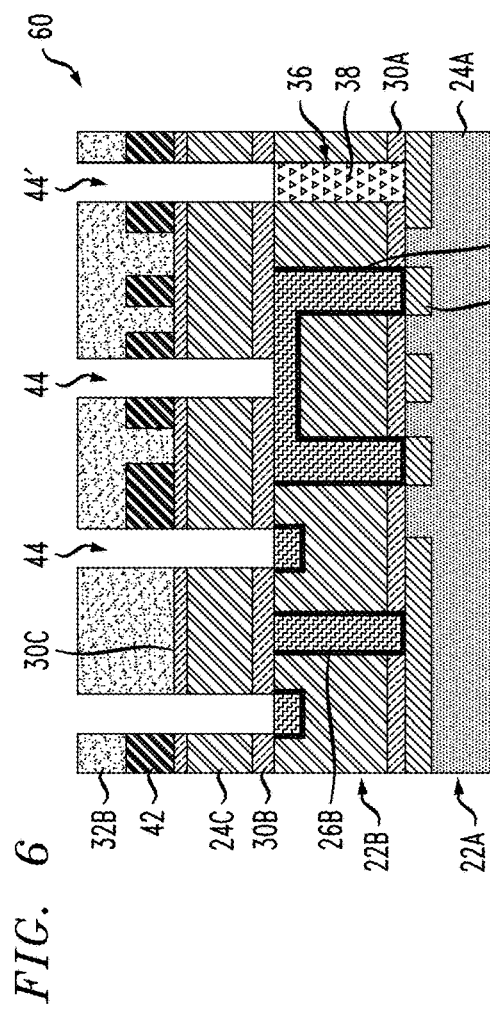
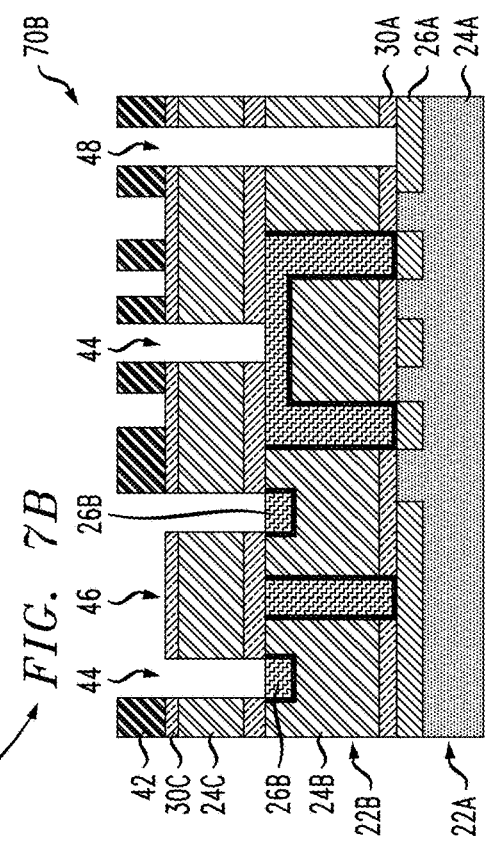
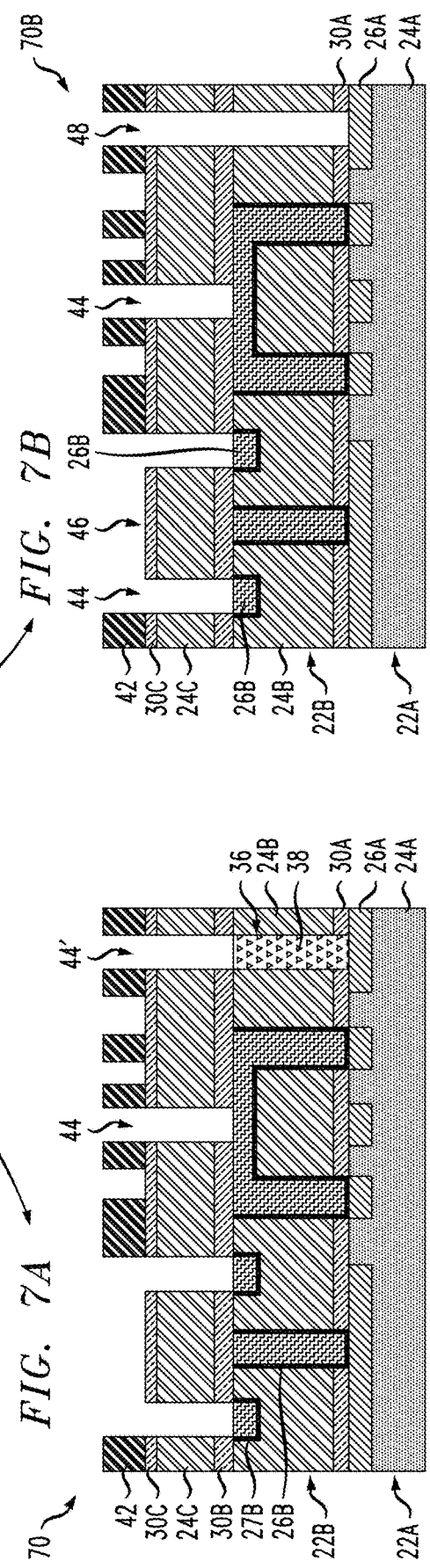

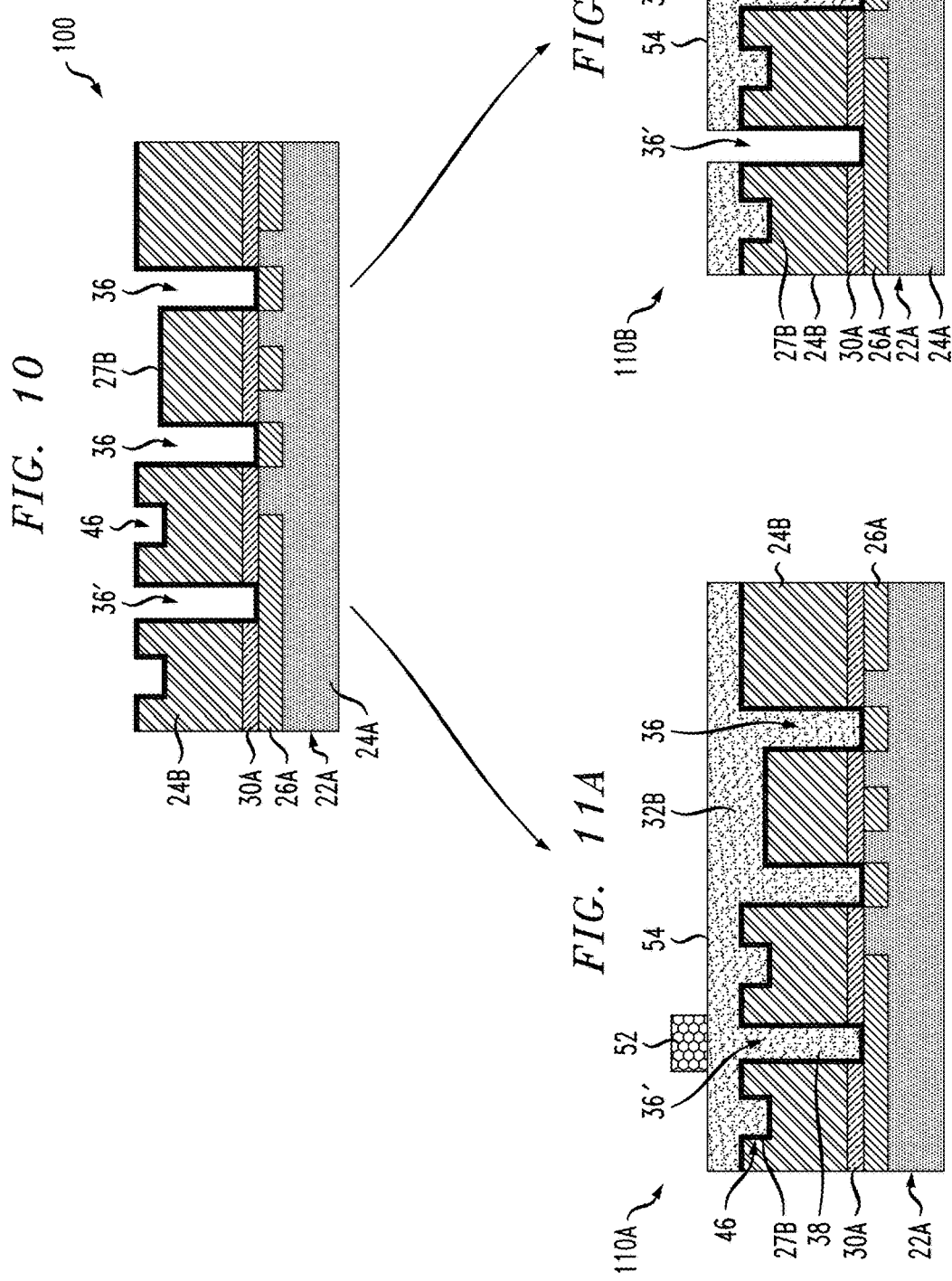

VIA INTERCONNECTS INCLUDING SUPER VIAS

BACKGROUND

The present invention relates generally to the electrical, electronic and computer arts and, more particularly, to via interconnect structures and their fabrication.

Silicon-based devices typically include multiple interconnect metallization layers above a device (front-end-of-line/ FEOL) layer that contains field-effect transistors (FETs) and/or other structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing may include intermediate-temperature steps for forming semiconductor-metal compounds (for example, silicides, germanosilicides) for electrical contacts. Back-end-of-line (BEOL) processing involves the creation of metal interconnecting wires that connect the devices formed in FEOL processing to form electrical circuits and may include silicidation as discussed above with respect to MOL processing. The metal lines including the interconnecting wires are deposited in sequence (e.g. M1, M2, M3, etc.) above the FEOL layer and include dielectric layers comprising trenches and vias therein that are filled with electrical conductors. Trench openings are conventionally formed in the dielectric layer by using, for example, known damascene or dual damascene techniques. The interconnecting wires within each metal line are electrically connected to interconnecting wires in other metal lines and to the devices in the FEOL layer. BEOL processing typically includes low-temperature steps for forming metal wires and preserving temperature sensitive FEOL and MOL structures. Narrow metal lines are required for some applications.

BEOL processing involves the formation of interconnects above the MOL layers. A chip may have multiple BEOL interconnect layers. Each layer, which has a wiring scheme, is connected to another layer by vias. Damascene copper wires are often chosen to reduce the wire resistance due to superior electrical conductivity of copper. The wires are formed within dielectric layers, one or more of which may comprise low-k material. Dual damascene patterning involves the deposition and patterning of hard masks on a dielectric layer to be patterned. A trench pattern can be etched into one hard mask and a via pattern can be formed in another hard mask. The via pattern is aligned with selected portions of the trench hard mask to facilitate formation of self-aligned vias (SAVs). Fully aligned vias (FAVs) use pre-existing under-layer metal for even narrower alignment in BEOL processing.

A super via structure is generally understood as a vertical electrical connection that spans two metal layers without a landing pad on an intermediate metal layer. If employed, super via structures are formed during BEOL processing. Super vias are also known in the art as skip vias.

BRIEF SUMMARY

Interconnect structures having super vias are formed while maintaining desired critical dimensions (CD).

A method of forming a monolithic interconnect structure including a super via includes patterning a second dielectric layer positioned above a first interconnect layer including a first dielectric layer and a first metal layer, forming a placeholder via through the second dielectric layer, filling the placeholder via with sacrificial placeholder material, and forming a patterned third dielectric layer above the second dielectric layer. The patterned third dielectric layer includes a selected via vertically aligned with the placeholder via. A super via is formed by removing the sacrificial placeholder material from the placeholder via such that the placeholder via and the selected via form, respectively, lower and upper portions of the super via extending from the patterned third dielectric layer to the first interconnect layer.

In accordance with a further embodiment, a method of forming an interconnect structure including a super via includes obtaining a monolithic structure including a first interconnect layer including a first dielectric layer and a first metal layer, a second interconnect layer including a second dielectric layer and a second metal layer, a first dielectric cap layer between the first interconnect layer and the second interconnect layer, a placeholder via extending through the second interconnect layer and the first dielectric cap layer, the placeholder via containing sacrificial placeholder material, and a second dielectric cap layer over the second dielectric layer. A third dielectric layer is deposited over the second interconnect layer and a plurality of vias are formed through the third dielectric layer, a selected one of the vias being vertically aligned with the placeholder via. A super via is formed through the third dielectric layer, the second interconnect layer, and the first dielectric cap layer. Forming the super via includes removing the sacrificial placeholder material from the placeholder via such that the placeholder via and the selected one of the vias extending through the third dielectric layer form, respectively, lower and upper portions of the super via extending from the patterned third dielectric layer to the first interconnect layer.

In a further aspect of the invention, an interconnect structure includes a first interconnect layer including a first dielectric layer and a first metal layer, a second interconnect layer including a second dielectric layer and a second metal layer, and a first dielectric cap layer between the first interconnect layer and the second interconnect layer. A placeholder via extends through the second interconnect layer and the first dielectric cap layer and contains sacrificial placeholder material. A second dielectric cap layer is positioned over the second dielectric layer. A patterned third dielectric layer over the second dielectric cap layer includes an upper super via portion vertically aligned with the placeholder via, the placeholder via comprising a bottom super via portion. The bottom super via portion and the upper super via portion comprise portions of a super via extending from the third dielectric layer to the first interconnect layer.

Techniques and structures as disclosed herein can provide substantial beneficial technical effects. By way of example only and without limitation, one or more embodiments may provide one or more of the following advantages:

Maintaining super via critical dimensions without degrading top super via levels;
  Avoiding unwanted lateral recessing of bottom super via portions;
  Avoiding super via BEOL/MOL transition challenges;
  CD control of bottom and top super via portions;
  Reduced overall capacitance and resistance.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 6 is a schematic, cross-sectional view showing the structure of FIG. 5 following formation of vias through the top dielectric layer down to the second metallized interconnect layer;

FIG. 7A is a schematic, cross-sectional view thereof following removal of the organic planarization layer in accordance with one exemplary embodiment;

FIG. 7B is a schematic, cross-sectional view thereof following removal of the organic planarization layer and dielectric trench formation in accordance with a second exemplary embodiment;

FIG. 10 is a schematic, cross-sectional view of a monolithic structure including a first metallized interconnect layer and a patterned dielectric layer over the first metallized interconnect layer;

FIG. 11A is a schematic, cross-sectional view thereof following deposition of an organic planarization layer and a patterned photoresist layer in accordance with a first exemplary process;

FIG. 11B is a schematic, cross-sectional view thereof following deposition and patterning of an organic planarization layer photoresist layer in accordance with a second exemplary process;

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Via structures are used for electrically connecting wiring layers to each other or to devices. Vias often have nanoscopic dimensions that need to be within predefined limits. A structure or space having nanoscopic dimensions, such as a via or trench, includes one or more dimensions less than one hundred nanometers. The height and width of trenches in interconnect structures can both be less than one hundred nanometers. Dual damascene interconnects with self aligned vias (SAVs) can minimize alignment issues and improve reliability, for example TDDB (time dependent dielectric breakdown) and performance. Super via (SVIA) structures may be advantageous in minimizing capacitance and resistance.

Super via structures are formed through multiple interconnect layers and accordingly may extend through multiple dielectric layers. It is desirable to ensure that the appropriate critical dimensions (CDs) of all portions of the super via structures are obtained during their fabrication. If, for example, additional etch time is required to obtain the minimum CD of the bottom portion of a super via structure, the top portion of the super via structure may deteriorate, causing the CD of the top portion to be incorrect. In accordance with one or more embodiments of the invention, the bottom SVIA CD is maintained without degrading the top portion of the SVIA through the use of a sacrificial SVIA placeholder that maintains the CD of the bottom portion of the super via while the top portion thereof is formed.

Figure 1:
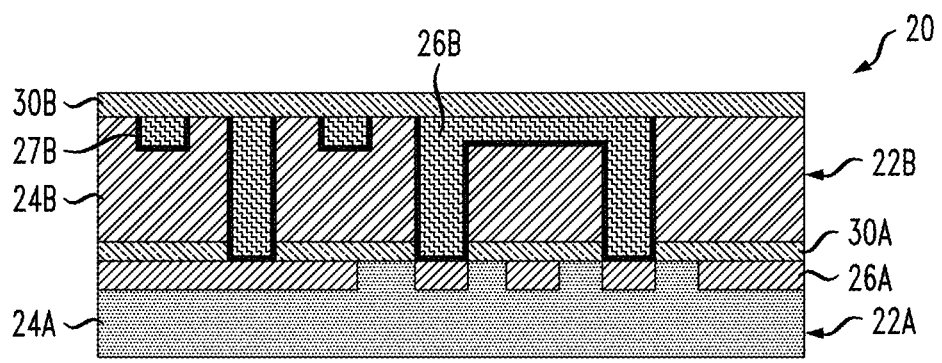
FIG. 1 is a schematic, cross-sectional view showing a portion of a structure including first and second metallized interconnect layers.

A monolithic structure 20 shown in FIG. 1 is obtained following FEOL processing, formation of patterned inter-level dielectric (ILD) layers over a semiconductor substrate (not shown), metallization, and chemical mechanical planarization (CMP). Interconnect line/via patterns are conventionally formed in ILD layers by using, for example, known damascene or dual damascene techniques. A patterning stack including hard masks and lithographic masks is formed on an ILD layer followed by etching steps. Specifically, a photoresist (not shown) may be applied over an ILD layer. The photoresist can be applied by any suitable technique, including, but not limited to coating or spin-on techniques. A mask (not shown), which is patterned with shapes defining trench openings and/or vias to be formed, is provided over the photoresist, and the mask pattern is transferred to the photoresist using a photolithographic process, which creates recesses in the uncovered regions of the photoresist. The patterned photoresist is subsequently used to create the same pattern of trenches and vias in the ILD layer through conventional etching typically used for forming trenches and contact holes. Dry etch (for example, a reactive ion etch) techniques may be employed to form such horizontally extending trenches and vertically extending vias. In some embodiments, the ILD layer includes multiple layers that may be selectively etched. After formation of trench openings and vias, the photoresist may be stripped by ashing or other suitable process from the ILD layer. The resulting structure may be subjected to a wet clean.

ILD layers may be deposited on the substrate using, for example, deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The ILD layers may include, but are not necessarily limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using PECVD. ILD layers may, in some embodiments, comprise an ultra low-k (ULK) dielectric material having a dielectric constant of 2.5 or below.

Referring again to FIG. 1, the monolithic structure 20 includes a first interconnect layer 22A that comprises a first dielectric layer 24A and a first metal layer 26A. A second interconnect layer 22B is formed over the first interconnect layer using dual damascene techniques followed by metallization. The second interconnect layer 22B includes an ILD layer (second dielectric layer 24B) and a second metal layer 26B. In one or more embodiments, the second interconnect layer 22B is an M2/V1 layer. In other words, it is the second layer or level of the structure to include metal, but the first level to include one or more vias. A liner 27B having barrier properties is positioned between the second dielectric layer 24B and the second metal layer 26B. The first and second dielectric layers 24A, 24B may or may not comprise the same dielectric material(s). The monolithic structure 20 further includes a first cap layer 30A adjoining the top surface of the first interconnect layer 22A and a second cap layer 30B adjoining the top surface of the second interconnect layer 22B.

The liner 27B is formed by depositing conformal layer(s) of liner material(s) on the patterned dielectric (ILD) layer 24B. The sidewalls and bottom surfaces of the trenches and vias within the second ILD layer 24B are lined with layer(s) of electrically conductive materials. The liner material may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB which are suitable for the given application. The thin liner serves as a barrier diffusion layer and adhesion layer. The conformal layer of liner material may be deposited using known techniques such as CVD, ALD, or PVD.

In an exemplary embodiment, a barrier layer including TaN or TiN is deposited directly on the patterned dielectric layer 24B and a cobalt or ruthenium liner is deposited on the barrier layer to form the liner 27B. A thin conformal copper (Cu) seed layer can be deposited over the surface of the liner 27B using PVD, followed by the electroplating of Cu to fill the damascene (or dual damascene) openings in the second dielectric layer 24B. A thermal anneal stage follows electroplating. In one example, cobalt is present in thin layers as a metal liner layer (e.g., 1 to 100 angstroms) between a TaN barrier layer and a Cu fill layer. The deposited layers 27B, 26B form metal lines that extend horizontally and vertically within the second ILD layer 24B. One or more of the metal lines may be electrically connected to the underlying first interconnect layer 22A.

The overburden barrier, liner, seed, and metallization materials may be removed by performing a multi-step chemical mechanical polishing process (CMP) to planarize the surface of the monolithic structure down to the top surface of the second dielectric layer 24B. A second cap layer 30B is formed on the resulting structure to obtain a monolithic interconnect structure 20 as illustrated in FIG. 1.

The cap layers 30A, 30B may be conformally deposited using a suitable deposition technique, such as, for example, CVD, PECVD, RFCVD, PVD, ALD, MBD, PLD, and/or sputtering. The cap layers may comprise, for example, silicon nitride (SiN), silicon carbonitride (SiCN), aluminum oxide ($AlO_x$) or other suitable material that inhibits the diffusion of copper. The cap layers may, for example, comprise a low-k silicon carbonitride material such as Blok™. This material comprises Si, C, O, H, and N, is marketed by Applied Materials, Inc., and can be deposited using PECVD. The cap layers can have a vertical thickness ranging from about three nanometers (3 nm) to about twenty nanometers (20 nm).

Figure 2:
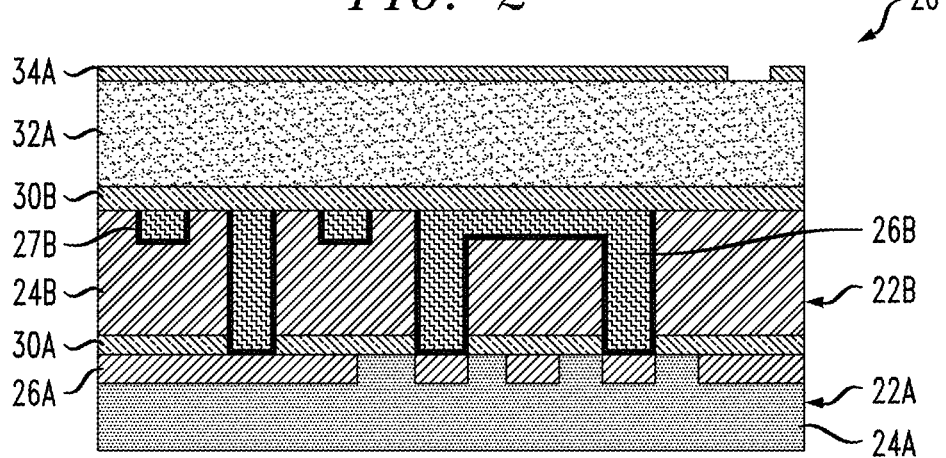
FIG. 2 is a schematic, cross-sectional view showing the structure of FIG. 1 following deposition of an organic planarization layer and a further cap layer.

Referring to FIG. 2, an organic planarization layer 32A, a hardmask/cap layer 34A, and a photoresist layer (not shown) are deposited, respectively, on the monolithic structure 20 shown in FIG. 1 and subjected to photolithography to form one or more openings 36 in the hardmask 34A. The hardmask may be comprised of the same materials as the cap layers 30A, 30B. The diameters of the openings 36 correspond to the CDs of the bottom portions of the super vias to be formed within the monolithic structure. Photolithography can include utilizing a multilayer patterning scheme such as a trilayer scheme. Exemplary trilayer schemes generally include a photoresist, a silicon-containing hardmask underlying the photoresist, and an organic dielectric layer underlying the silicon-containing hardmask and overlying a substrate to be patterned. Patterning of the silicon-containing hardmask and organic dielectric layer typically includes reactive ion etch (ME) chemistry. In particular, the silicon-containing hardmask and the organic underlayer are generally configured to provide alternating etch selectivities towards fluorine- and oxygen-containing RIE chemistry to allow for highly selective pattern transfer from the photoresist on top of the silicon-containing hardmask into the hardmask and cap layer (30B in FIG. 2) below the organic underlayer. In some embodiments, a reductive ME chemistry can be used, e.g., $N_2/H_2$.

FIG. 2 depicts an opening 36 formed in the hardmask 34A using a trilayer scheme or any other suitable process. The vertical axis of opening 36 corresponds to the location of a portion of a super via to be formed later in the process. Further etching, which may include a sequence of etches using different etch chemistries in different layers, causes the opening 36 to be extended through the organic layer 32A, the second cap layer 30B, the second dielectric layer 24B of the second interconnect layer 22B, and the first cap layer 30A. The portion of the opening 36 extending through the second cap layer 30B, the second dielectric layer 24B, and the first cap layer 30A can be referred to as a placeholder via.

Figure 3:
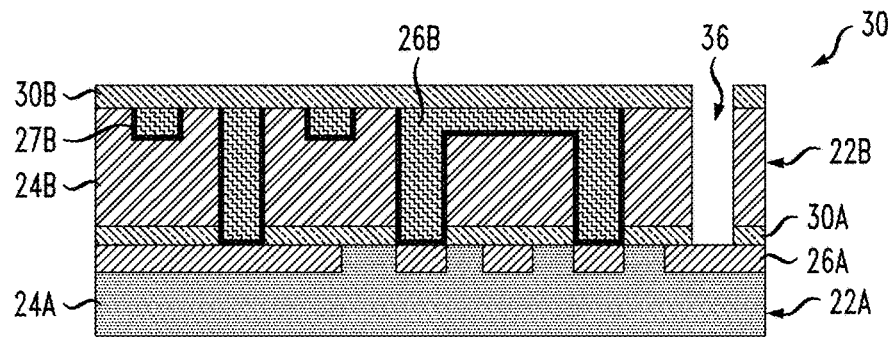
FIG. 3 is a schematic, cross-sectional view showing the structure of FIG. 2 following formation of the bottom portion of a vertical super via opening through the second metallized interconnect layer.

As shown in FIG. 3, the opening(s) 36 formed using trilayer scheme patterning are transferred through the second interconnect layer 22B down to the first metal layer 26A within the first interconnect layer 22A. The etching process can be a dry etch (e.g., reactive ion etch, plasma etching, ion beam etch, or laser ablation) and/or a wet chemical etch. After transferring the pattern, the patterned photoresist is removed utilizing resist stripping processes, for example, ashing. The hard mask and organic layer are removed to obtain the monolithic interconnect structure shown in FIG. 3. The interconnect structure includes first and second interconnect layers 22A, 22B, a first dielectric cap layer 30A between the first and second interconnect layers, and a second cap layer 30B on the second interconnect layer 22B and covering the top surface of the second dielectric layer 24B and the exposed top surface of the metal (wiring) layer 26B. The opening 36 comprises a placeholder via having the CD desired for the bottom portion of a super via that is completed later in the process.

Figure 4:
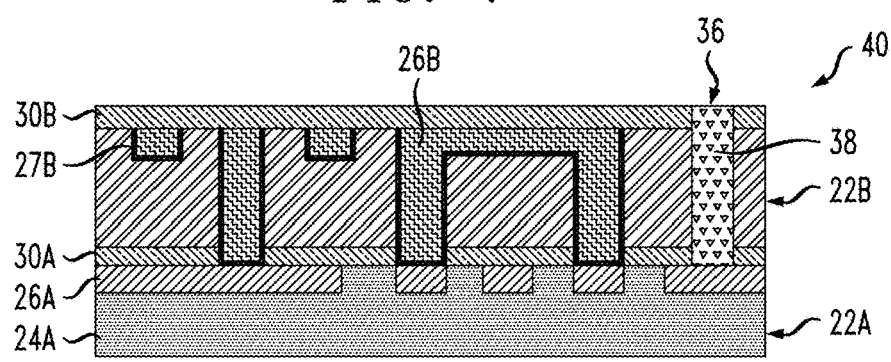
FIG. 4 is a schematic, cross-sectional view thereof following deposition of a sacrificial placeholder material within the bottom portion of the vertical super via opening.

As schematically illustrated in FIG. 4, the placeholder via(s) 36 is filled with sacrificial placeholder material to form a super via placeholder 38 for the bottom portion of a super via structure. The sacrificial material may be a dry strippable material such as an OPL layer or wet strippable material such as titanium nitride (TiN) or tungsten (W). A liner for protecting the second dielectric layer 24B during downstream processing may optionally be formed on the surfaces bounding the placeholder via(s) 36 prior to formation of the super via placeholder 38. A TiN or W liner is employed in some exemplary embodiments. Excess sacrificial placeholder material is removed to obtain an interconnect structure as shown in FIG. 4. The optional liner is later removed. The optional liner helps to protect from OPL migration into the ULK dielectric material and avoid ULK dielectric damage while removed.

Figure 5:
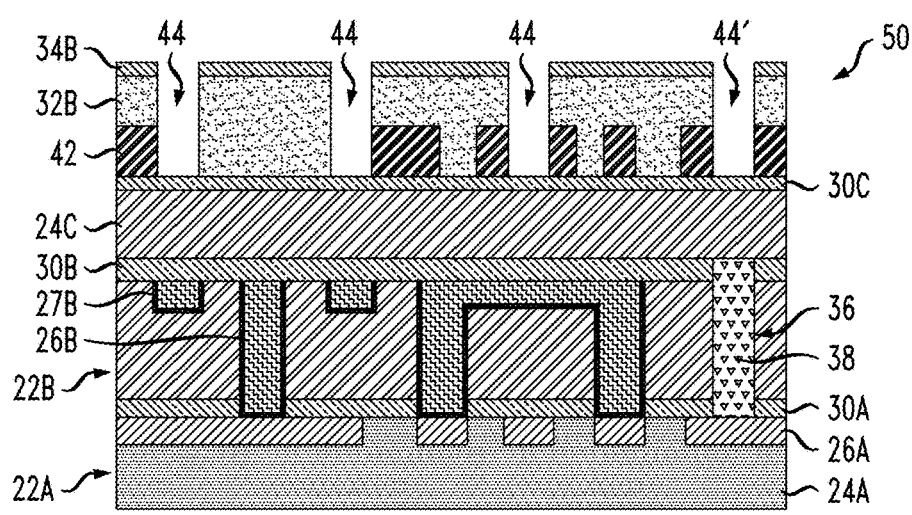
FIG. 5 is a schematic, cross-sectional view thereof following deposition of a top dielectric layer and a cap layer followed by deposition and patterning of mask layers.

A third interconnect layer is formed over the second interconnect layer 22B. Referring to FIG. 5, a third dielectric layer 24C for the third interconnect layer is formed on the second cap layer 30B. The third dielectric layer 24C may or may not be comprised of the same dielectric material that forms the second dielectric layer 24B and may or may not have the same properties thereof, such as dielectric constant and etch properties. A cap layer 30C is conformally deposited on the third dielectric layer 24C. In some embodiments, cap layer 30C is a TEOS or SiON layer deposited directly on the third dielectric layer 24C. A hardmask 42, organic planarization layer 32B and hardmask/cap layer 34B are deposited, respectively, on the cap layer 30C. In some embodiments, the hardmask 42 is a titanium nitride (TiN) layer deposited directly on the cap layer 30C and then patterned.

The monolithic structure 50 illustrated in FIG. 5 is obtained following dual damascene patterning of the hardmask 42, deposition of the organic planarization layer (OPL) 32B on the patterned hardmask, deposition of the hardmask/cap layer 34B, and formation of openings 44, 44' extending through the hardmask/cap layer 34B and the OPL 32B. The openings extend down to the cap layer 30C, which functions as an etch stop layer. One or more of the openings 44' are vertically aligned and preferably coaxial with the placeholder via(s) 36 within the second interconnect layer 22B that contain the sacrificial placeholder(s) 38. As shown in FIG. 6, the openings 44, 44' are extended through the cap layer 30C and third dielectric layer 24C down to the second interconnect layer 22B. Some of the openings 44 form vias extending down to the second metal layer 26B. Other opening(s) 44' extend down to the placeholder(s) 38 and form the top portions of super vias in the resulting monolithic structure 60. The placeholder(s) accordingly protect the bottom portions of the super vias while the top portions thereof are formed. The sacrificial material forming the placeholder 38 has a top surface that is coplanar with the top surface of the second cap layer 30B in this exemplary embodiment of the process.

The OPL 32B is removed from the monolithic structure 60 to obtain a monolithic structure 70A as schematically illustrated in FIG. 7A in some embodiments. The sacrificial placeholder 38 remains in the placeholder via 36 in the exemplary structure 70A. In other embodiments where the placeholder 38 is also a sacrificial organic layer, removal of the OPL 32B is accompanied by removal of the sacrificial material within the opening 36 that forms the bottom portion of the super via. Removal of the OPL 32B further exposes portions of the underlying structure that are to include trench(es). FIG. 7B schematically illustrates an exemplary structure 70B obtained in an embodiment wherein the placeholder via 36 through the second interconnect layer 22B is filled with an OPL. Removal of the OPL from the placeholder via 36 does not materially affect the CD of the bottom portion of the resulting super via 48 comprising the vertically aligned openings 44', 36. One or more trenches 46 are formed after the OPL removal using the hardmask 42, such as illustrated in FIG. 7B.

Figure 8:
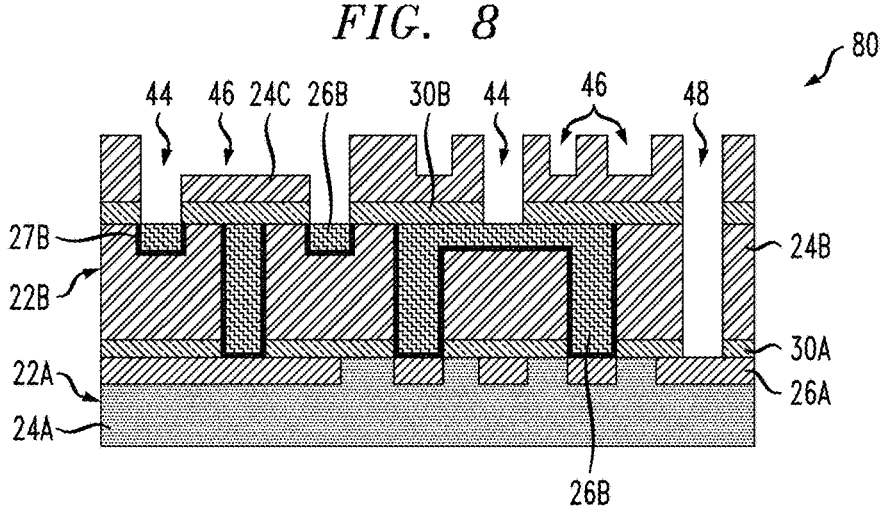
FIG. 8 is a schematic, cross-sectional view showing the structure of FIG. 7B following removal of a hard mask layer.

The sacrificial material, if remaining within the placeholder via 36 following removal of the OPL layer 32B as shown in FIG. 7A, is subsequently removed. As discussed above, the sacrificial material comprising the placeholder 38 and the material comprising the hardmask 42 are the same in some embodiments. In one exemplary embodiment, both the hardmask 42 and the via placeholder 38 are titanium nitride (TiN). They can accordingly be removed simultaneously using the same etch chemistry. A monolithic structure 80 as shown in FIG. 8 may be obtained following trench formation, removal of the hardmask 42 and via placeholder 38 from the structure 70A shown in FIG. 7A and subsequent removal of the top cap layer 30C. Such a structure 80 can be obtained whether the via placeholder 38 was removed prior to removal of the hardmask 42, simultaneously with the hardmask 42, or subsequent to hardmask removal.

Vias formed by openings 44 within the structure 80, shown in FIG. 8, extend to the metal layer 26B of the second interconnect layer 22B while the super via(s) 48 extends to the metal layer 26A of the first interconnect layer 22A. Trenches 46 are also formed in the third dielectric layer 24C. As the top and bottom portions of the super via(s) are formed in separate stages of the process, the CD of each portion can be carefully controlled. Lateral recess damage of the pre-formed bottom super via portion(s) is avoided as it is protected while the top portion of the super via(s) is formed. As discussed above, the process further allows a liner to be formed in the bottom portions of the super vias prior to placeholder formation. Such a liner helps prevent damage to the second ILD layer 24B while stripping the OPL in embodiments wherein the placeholder comprises an OPL.

Figure 9A:
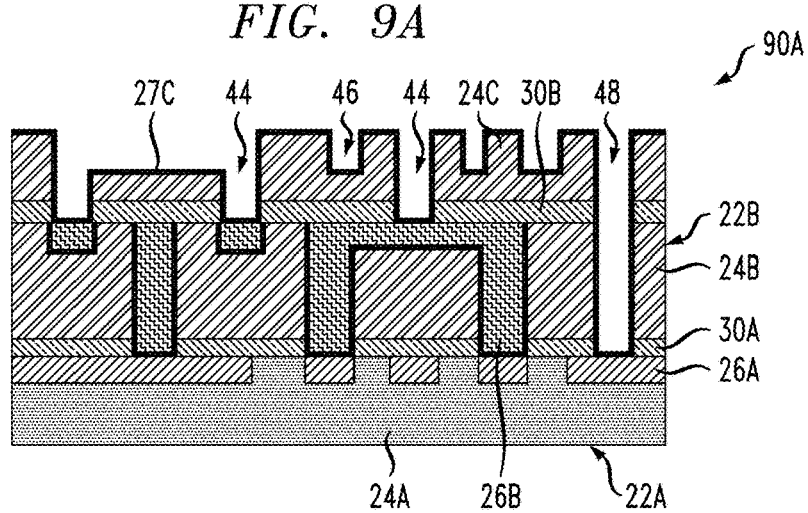
FIG. 9A is a schematic, cross-sectional view thereof following deposition of a liner on the top dielectric layer.
Figure 9B:
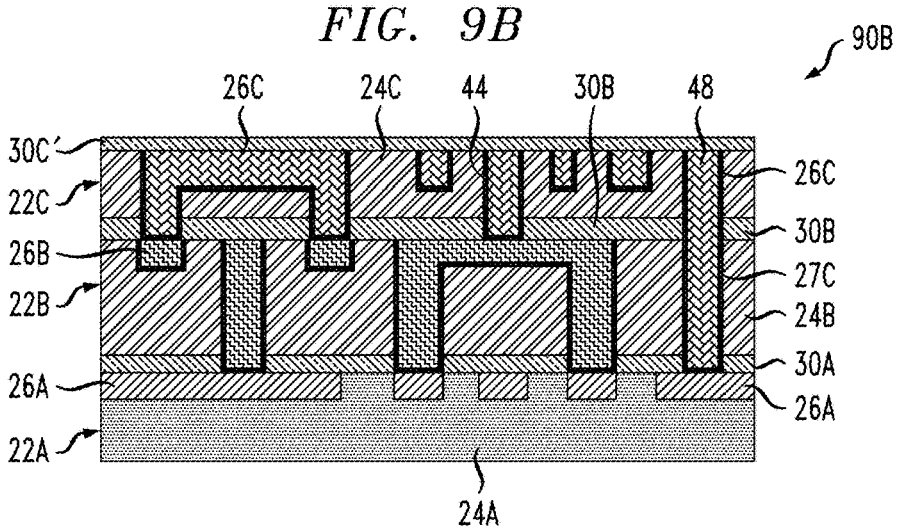
FIG. 9B is a schematic, cross-sectional view thereof following metallization of the structure illustrated in FIG. 9A and deposition of a further cap layer.

A further stage in the fabrication process includes depositing a conformal layer(s) of liner material to form a liner 27C having barrier properties on the third dielectric layer (ILD) 24C. In some embodiments, the liner 27C comprises the same material(s) as the previously formed liner 27B in the second interconnect layer 22B. The liner adjoins the sidewalls and bottom surfaces of the trenches 46, the vias 44, and the super via(s) 48. It further directly contacts the exposed surfaces of the metal layers 26A, 26B directly beneath the vias 44 and super via(s) 48. A thin copper (Cu) seed layer can be deposited over the surface of the metal liner 30' using PVD, followed by the electroplating of Cu to fill the dual damascene openings (trenches 46, vias 44, super via 48) in the top ILD layer 24C. A low-temperature thermal anneal (<200° C.) follows electroplating. A structure 90A as schematically illustrated in FIG. 9A may be obtained following deposition of the liner. FIG. 9B shows an exemplary structure 90B including interconnect metal fill that forms a third metal layer 26C of a third interconnect layer 22C. The vias 44 and super via 48 containing the metal fill are electrically connected to selected underlying metal lines within the underlying interconnect layers 22B, 22A, respectively.

The overburden liner, seed, and metallization materials are removed by a chemical mechanical polishing process (CMP) to planarize the surface of the structure down to the top surface of the third ILD layer 24C. A metal cap layer (not shown) may be selectively deposited on the exposed top surfaces of the metal interconnect lines formed within the trenches 46 and vias from the interconnect metal fill layer. For example, metals including, but not limited to, cobalt, ruthenium or manganese may be deposited using chemical vapor deposition or atomic layer deposition to form the metal cap layer. In some embodiments, the metal cap layer comprises materials immiscible with liquid copper such as Ta or Ru. Post-deposition cleaning may be required to ensure there is no leakage or degradation resulting from possible metal residues on the resulting structure. FIG. 9B schematically illustrates an exemplary monolithic structure 90B following planarization and of the structure down to the ILD layer 24C and replacement of the cap layer 30C with a new cap layer 30C'. It will be appreciated that additional interconnect layers (not shown) may be formed on the structure 90B using damascene or dual damascene techniques. Such additional interconnect layers may include super vias formed using procedures similar to those described herein.

Alternative techniques for forming super vias are discussed with respect to FIG. 10 and subsequent figures. The same reference numerals employed with respect to FIGS. 1-9B are employed in FIG. 10 to designate the same or similar elements. A monolithic structure 100 includes a first interconnect layer 22A and a dual damascene patterned dielectric layer 24B over the first interconnect layer. The patterned dielectric layer 24B includes trenches 46 and vias 36, 36'. The vias 36, 36' extend down to the metal layer 26A within the first interconnect layer. A liner 27B is optionally deposited conformally on the dielectric layer 24B for preventing damage thereto upon stripping an OPL layer (not shown) therefrom during downstream processing. In some embodiments, the dielectric layer 24B is an ultra low-k (ULK) dielectric layer. The structure 100 may be formed over an FEOL layer (not shown).

Subsequent to fabricating a monolithic structure 100 as shown in FIG. 10, a first process flow path includes forming a structure 110A as schematically illustrated in FIG. 11A. An organic planarization layer 32B is deposited on the structure and extends over the top surface of the dielectric layer 24B. It also fills the vias and trenches therein. A silicon anti-reflecting coating (Si-ARC) 54 is deposited on the top surface of the OPL 32B. A photoresist layer 52 is deposited over the OPL 32B and patterned. The photoresist layer includes portions that are vertically aligned with one or more of the vias 36' extending through the second dielectric layer 24B. The vias beneath the photoresist will form the bottom portions of super vias, as discussed below. The portions of the OPL 32B filling or more of the vias are placeholders 38 for the bottom portions of the super vias that are formed in downstream processing. In contrast to the process described above with respect to FIGS. 1-9B, the placeholder(s) 38 is formed prior to metallization of the second interconnect layer 22B and the deposition of the cap layer 30B.

Figure 12A:
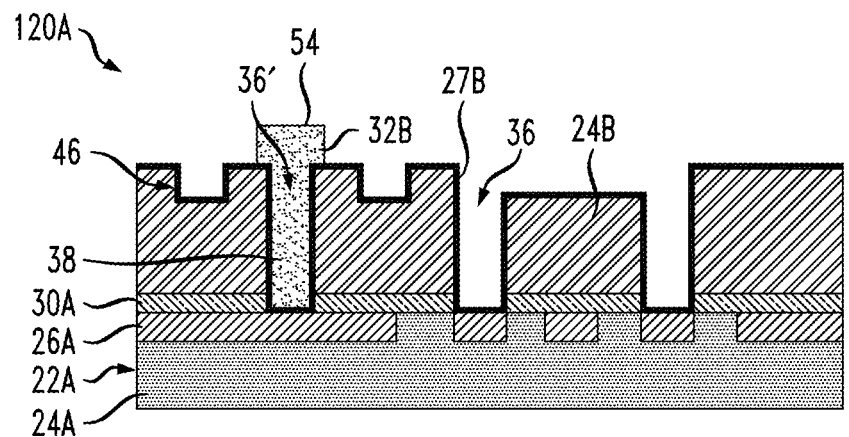
FIG. 12A is a schematic, cross-sectional view of the structure of FIG. 11A following removal of exposed portions of the organic planarization layer.

The OPL 32B is removed from the underlying structure except for the regions protected by the photoresist layer 52. As shown in FIG. 12A, the resulting structure 120A includes one or more sacrificial super via placeholders 38 similar to those described above. The other vias 36 and the trenches within the dielectric layer 24B of the structure are open. The protective liner 27B, if employed, remains in place.

Figure 13A:
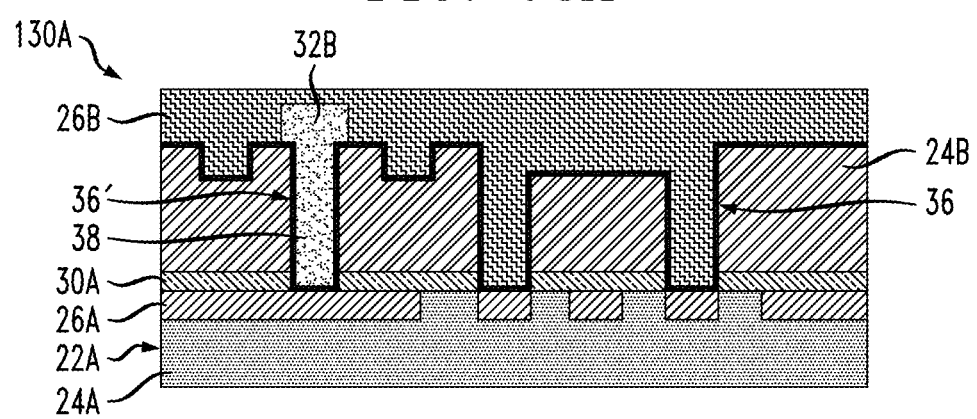
FIG. 13A is a schematic, cross-sectional view of the structure shown in FIG. 12A following metallization.

Metallization of the structure 120A causes the trenches and some of the vias 36 within the dielectric layer 24B to be filled with a metal such as copper. A metallization process is discussed above with respect to FIG. 1 and can be employed in forming a structure 130A as schematically illustrated in FIG. 13A. The deposited materials form a second metal layer 26B, portions of which are electrically connected to the first metal layer 26A. An additional liner (not shown) can be deposited prior to copper deposition. Such a liner, if employed, would extend over the OPL "cap" 32B' and function as a copper diffusion barrier. The via(s) 36' containing the sacrificial OPL placeholder(s) 38 remain free of metal at this stage of the process.

Figure 14A:
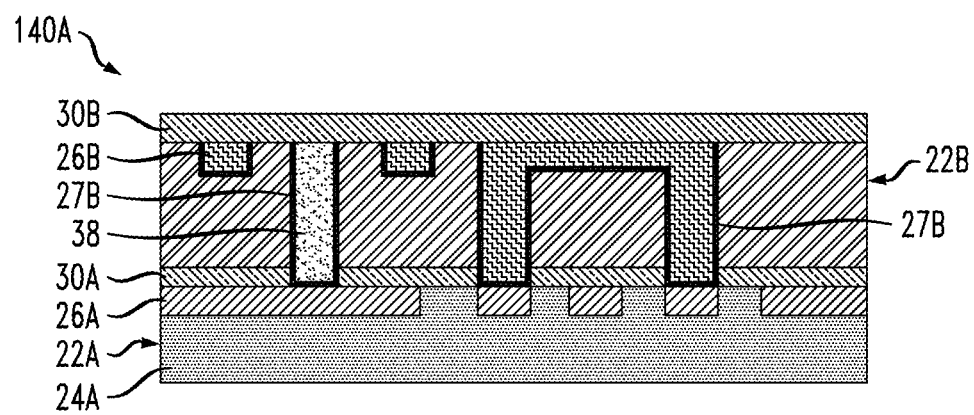
FIG. 14A is a schematic, cross-sectional view of the structure shown in FIG. 13A following planarization to remove OPL and metal overburden and deposition of a cap layer.

The overburden barrier, liner, seed, and metallization materials may be removed by performing a multi-step chemical mechanical polishing process (CMP) to planarize the surface of the monolithic structure 130A down to the top surface of the ILD layer 24B. A second cap layer 30B is formed on the resulting structure to obtain the monolithic structure 140A as illustrated in FIG. 14A. In this embodiment, the placeholder via 36' and sacrificial placeholder 38 therein extend through the first cap layer 30A and the second dielectric layer 24B. The second cap layer 30B extends over the top surface of the placeholder 38.

In an alternative embodiment, a patterned OPL layer is formed on the structure 100 shown in FIG. 10 such that the via(s) 36' within the dielectric layer 24B that are intended to form the bottom portion(s) of super vias are devoid of OPL material while the remainder of the structure, including other vias 36 and trenches therein, remain covered or filled by the OPL 32B. Referring to FIG. 11B, the open via 36' extends through the OPL and the dielectric layer 24B of the structure 110B down to the liner 27B on the top surface of the first metal layer 26A.

Figure 12B:
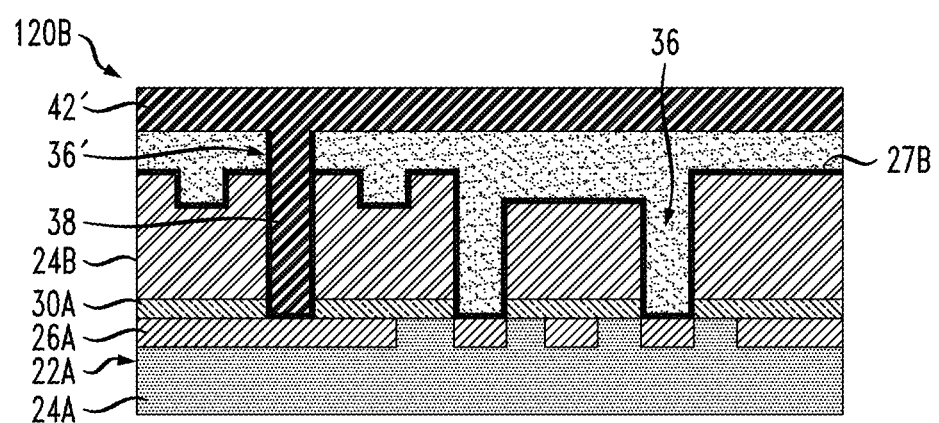
FIG. 12B is a schematic, cross-sectional view of the structure of FIG. 11B following deposition of a sacrificial layer over the patterned organic planarization layer.

A sacrificial layer 42' is deposited on the structure 110B. The sacrificial layer may be the same material employed as a hardmask 42 as described above with respect to FIG. 5. The sacrificial layer 42' adjoins the top surface of the OPL 32B and fills the open via(s) 36'. As schematically illustrated in FIG. 12B, the dielectric layer 24B of the resulting structure 120B includes trenches and some vias filled with OPL material and a via filled with sacrificial material. A titanium nitride or tungsten layer may be deposited on the structure 110B to form the sacrificial layer 42' in some embodiments. In embodiments including a sacrificial tungsten (W) layer, such a layer may be deposited using chemical vapor deposition conducted between 300-400° C. and using tungsten hexafluoride precursor chemistry.

Figure 13B:
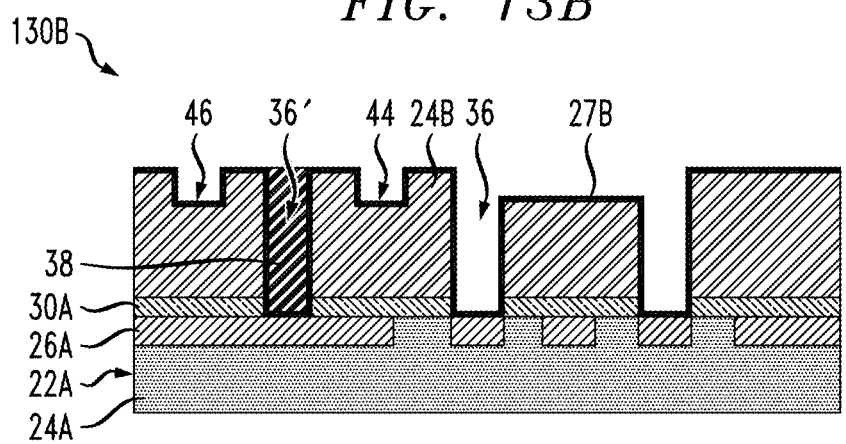
FIG. 13B is a schematic, cross-sectional view of the structure shown in FIG. 12B following sacrificial layer removal, planarization and removal of the patterned organic planarization layer.

Referring to FIG. 13B, the structure 120B is subjected to chemical mechanical planarization (CMP) to remove the portions of the sacrificial layer 42 above the top surface of the dielectric layer 24B. The remaining portions of the OPL are stripped, thereby opening the trenches in the second dielectric layer 24B and the vias 36 that were previously filled with OPL material. The sacrificial layer 42 remains within the via(s) 36' that will form the bottom portions of super vias. The portions of the liner 27B on the top surface of the dielectric layer 24B are also removed.

Figure 14B:
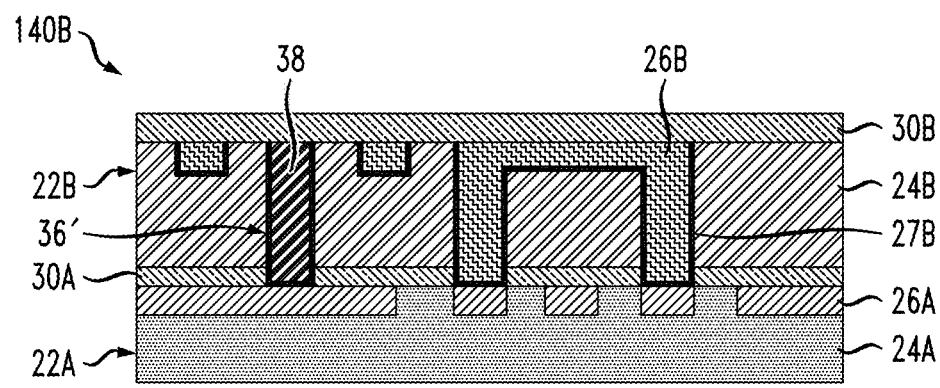
FIG. 14B is a schematic, cross-sectional view of the structure shown in FIG. 13B following metallization, planarization, and the deposition of a cap layer.

A metal layer 26B is deposited on the resulting structure and subjected to CMP to remove overburden. An exemplary process for depositing a metal interconnect layer is discussed above and may also be employed in this exemplary embodiment. A second cap layer 30B is then formed over the structure, covering the top surfaces of the dielectric layer 24B, the metal layer 26B and the placeholder(s) 38 comprising the sacrificial material used to form the sacrificial layer 42 (e.g. TiN, W). The resulting structure 140B includes first and second metal interconnect layers 22A, 22B, as schematically illustrated in FIG. 14B.

Figure 15:
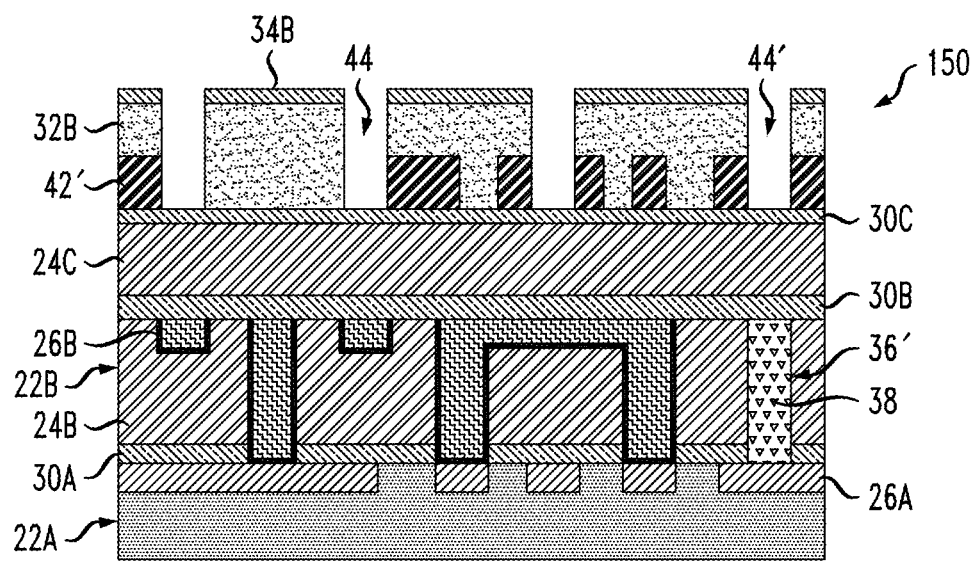
FIG. 15 is a schematic, cross-section view showing a top stack formation on a monolithic structure including first and second interconnect layers and a placeholder via including sacrificial placeholder material.

An exemplary monolithic structure 150 is schematically illustrated in FIG. 15 and shows a process stage of forming an interconnect layer, for example an M3/V2 interconnect layer, over a stack of interconnect layers 22A, 22B. Like the structures 140A and 140B described above, the structure 150 includes a sacrificial placeholder 38 formed in the second dielectric layer 24B prior to deposition of the second dielectric cap layer 30B. The second dielectric cap layer 30B accordingly covers the top surface of the second interconnect layer 22B as well as the top surface of the placeholder 38. The process of building the third interconnect layer and the top portion of one or more super vias is similar to that described above with respect to FIGS. 1-9B.

A third dielectric layer 24C and a dielectric cap layer 30C are deposited, respectively, on the top surface of the second dielectric cap layer 30B. Similar to the process described above with respect to FIG. 5, a patterned hardmask layer 42, an organic planarization layer 32B, and a dielectric hardmask 34B are deposited over the dielectric cap layer 30C. The via pattern is aligned with selected portions of the trench hard mask to facilitate formation of self aligned vias (SAVs) including one or more super vias. Fully aligned via (FAV) are use pre-existing under layer metal for even narrower alignment. Openings 44, 44' through the hardmask 34B and OPL 32B are aligned with the via pattern in the hardmask layer. The diameter(s) of the openings 44 correspond to the critical dimension(s) of the vias to be formed in further processing.

Figure 16:
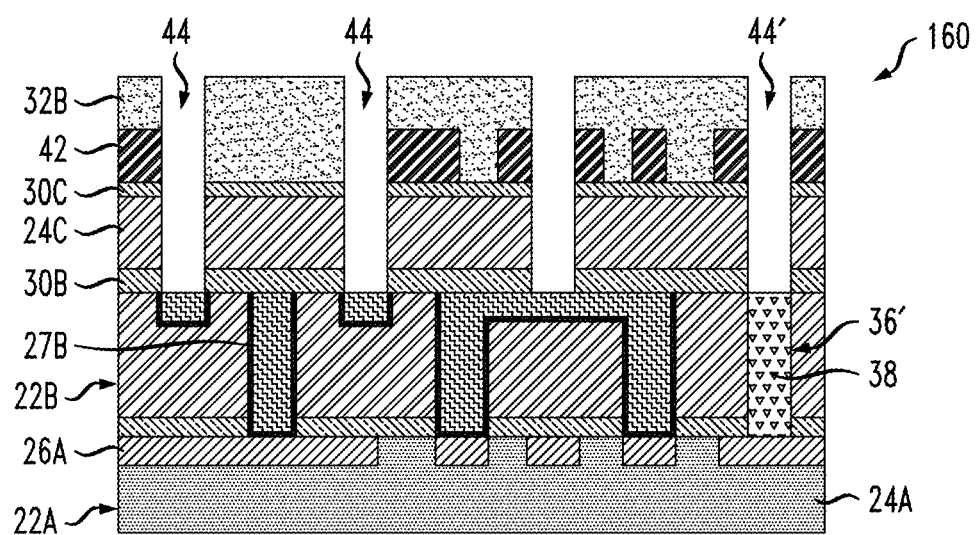
FIG. 16 is a schematic, cross-sectional view showing the structure of FIG. 15 following the patterning of a top dielectric layer thereon.

Referring to FIG. 16, the openings 44 are extended through the cap layer 30C, the third dielectric layer 24B and the second cap layer 30B, respectively, to form vias therein. The hardmask 34B is removed. A sequence of reactive ion etches may be employed to extend the openings 44 through two cap layers 30C, 30B and the dielectric layer 24C therebetween. Some of the openings 44 extend down to the second metal layer 26B. Other opening(s) 44' extend down to the placeholder(s) 38. Because the bottom portions of the super vias have already been formed within the second dielectric layer 24B, the CD of the upper portions of the super via(s) is more easily controlled. The extra etch time that would otherwise be required to form a super via through two dielectric layers (e.g. layers 24B and 24C) and possibly cause unwanted enlargement of the upper portion of the super via is avoided. It will be appreciated that the second and third dielectric layers 24B, 24C may not have the same physical characteristics. The formation of lower and upper super via portions in separate stages obviates any problems that may arise from attempting to form super vias that extend through dielectric layers having different physical properties such as etch rates. The sacrificial placeholder 38 in the second dielectric layer 24B of the structure 160 is the same material (e.g. TiN, W) used to form the hardmask 42 in some embodiments and is OPL material in other embodiments. While the sacrificial placeholder can comprise other sacrificial materials, using the same materials as are employed in the hardmask 42 or OPL facilitates downstream processing.

Figure 17A:
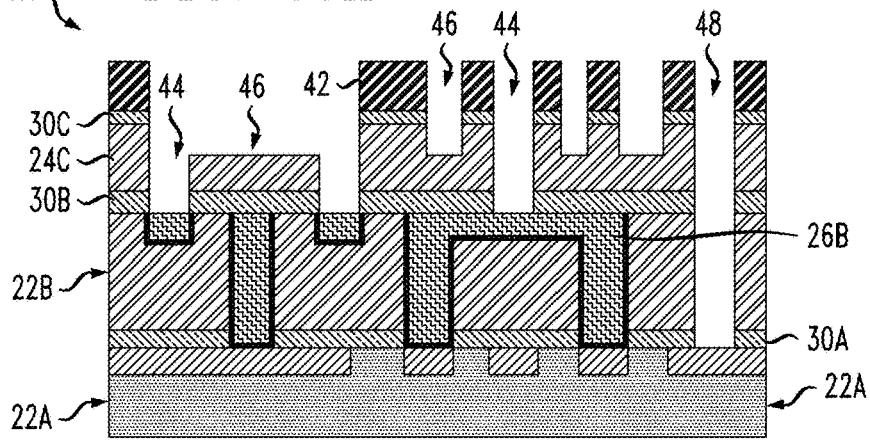
FIG. 17A is a schematic, cross-sectional view showing the structure of FIG. 16 following removal of an organic planarization layer and trench formation in accordance with one embodiment of an exemplary process.
Figure 17B:
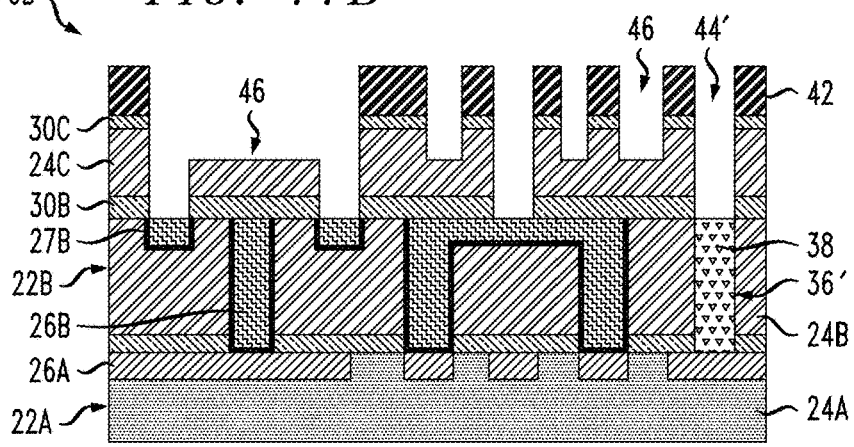
FIG. 17B is a schematic, cross-sectional view showing the structure of FIG. 16 following removal of an organic planarization layer and trench formation in accordance with a further embodiment of an exemplary process.

FIGS. 17A and 17B show the structure 160 of FIG. 16 following OPL removal and trench 46 formation. In the embodiment of FIG. 17A, the sacrificial placeholder is removed when the OPL is stripped, resulting in the structure 170A being obtained. The structure 170A includes a super via 48 comprising upper and lower super via portions through the third dielectric layer 24C and the second dielectric layer 24B, respectively, other vias 44 extending to the second metal layer 26B, and trenches 46 extending within the third dielectric layer 24C. In an embodiment wherein the sacrificial placeholder 38 is not OPL material, a structure 170B as schematically illustrated in FIG. 17B is obtained following removal of the OPL layer 32B and etching the third dielectric layer to form trenches. As discussed above, the sacrificial placeholder 38 and the hardmask 42 are the same material in some embodiments. Both elements remain following OPL removal in such embodiments.

Figure 18:
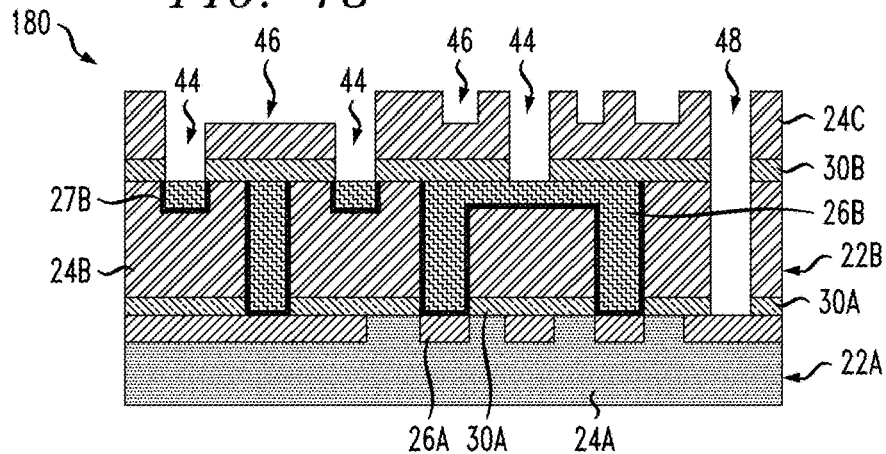
FIG. 18 is a schematic, cross-sectional view showing the structure of either FIG. 17A or FIG. 17B following removal of sacrificial materials It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

FIG. 18 shows an exemplary structure 180 obtained following selective removal of the hardmask 42 from either of the above-described structures 170A or 170B. In embodiments where the sacrificial placeholder(s) 38 within the second interconnect layer 22B and the hardmask 42 are the same material, they are removed using the same selective etch process. If the sacrificial placeholder has already been removed, only the hardmask 42 is removed during this stage of the process. The resulting structure 180 is subsequently subjected to metallization to fill the vias 44, trenches 46 and super via(s) 48 with metal as discussed above with respect to FIGS. 9A and 9B. Overburden is removed and a third dielectric cap layer is deposited. An interconnect structure similar to that shown in FIG. 9B can be obtained following such further processing of the exemplary structure 180.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, a method of forming a monolithic interconnect structure includes patterning a second dielectric layer 24B positioned above a first interconnect layer 22A including a first dielectric layer 24A and a first metal layer 26A. A placeholder via 36 is formed through the second dielectric layer 24B. FIGS. 3 and 10 illustrate exemplary structures including placeholder vias 36 as well as other vias 44 formed in the second dielectric layer. The placeholder via 36 is filled with sacrificial placeholder material. FIGS. 4, 11A and 12B show exemplary structures obtained following the filling of placeholder vias 36 with sacrificial material. A patterned third dielectric layer 24C is formed above the second dielectric layer 24B. As shown in FIG. 6 and FIG. 16, the patterned third dielectric layer includes a selected via 44' vertically aligned with the placeholder via 36. A super via 48 is formed by removing the sacrificial placeholder material from the placeholder via 36 such that the placeholder via 36 and the selected via 44' form, respectively, lower and upper portions of the super via 48 extending from the patterned third dielectric layer to the first interconnect layer. In one or more exemplary embodiments, the placeholder via further extends through a first dielectric cap layer 30A between the first and second dielectric layers. The method may further include forming a second dielectric cap layer 30B on the second dielectric layer and forming the placeholder via by etching an opening through both the second dielectric cap layer 30B and the second dielectric layer 24B as shown in FIG. 3.

A further method includes obtaining a monolithic structure including a first interconnect layer 22A including a first dielectric layer 24A and a first metal layer 26A, a second interconnect layer 22B including a second dielectric layer 24B and a second metal layer 26B, a first dielectric cap layer 30A between the first interconnect layer 22A and the second interconnect layer 22B, a placeholder via 36 extending through the second interconnect layer 22A and the first dielectric cap layer 30A, the placeholder via containing sacrificial placeholder material, and a second dielectric cap layer 30B over the second dielectric layer 22B. A third dielectric layer 24C is deposited over the second interconnect layer 22B and patterned, thereby forming a plurality of vias therethrough, a selected one of the vias 44' being vertically aligned with the placeholder via such as shown in FIGS. 6 and 16. A super via 48 is formed through the third dielectric layer 24C, the second interconnect layer 22B, and the first dielectric cap layer 30A. Forming the super via 48 includes removing the sacrificial placeholder material from the placeholder via such that the placeholder via and the selected one of the vias extending through the third dielectric layer form, respectively, lower and upper portions of the super via extending from the patterned third dielectric layer 24C to the first interconnect layer 22A. In some exemplary embodiments of the method, the placeholder via 36 extends through the second dielectric cap layer 30B as shown in FIG. 3. In other exemplary embodiments, the second dielectric cap layer 30B extends over the placeholder via and the sacrificial placeholder material, as shown in FIG. 14A.

Structures obtained in accordance with the principles of the inventions described herein include a first interconnect layer 22A including a first dielectric layer 24A and a first metal layer 26A, a second interconnect layer 22B including a second dielectric layer 24B and a second metal layer 26B, and a first dielectric cap layer 30A between the first interconnect layer and the second interconnect layer. A placeholder via 36 containing sacrificial placeholder material extends through the second interconnect layer 22B and the first dielectric cap layer. A second dielectric cap layer 30B extends over the second dielectric layer 24B. A patterned third dielectric layer 24C is positioned over the second dielectric cap layer 30B and includes an upper super via portion 44' vertically aligned with the placeholder via 36, the placeholder via 36 comprising a bottom super via portion. The bottom super via portion and the upper super via portion comprise portions of a super via extending from the third dielectric layer 24C to the first interconnect layer 22A.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including interconnect layers and associated structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below", "top" and "bottom", and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. An interconnect structure comprising:
    a first interconnect layer including a first dielectric layer and a first metal layer;
    a second interconnect layer including a second dielectric layer and a second metal layer;
    a first dielectric cap layer between the first interconnect layer and the second interconnect layer;
    a placeholder via extending through the second interconnect layer and the first dielectric cap layer, the placeholder via containing sacrificial placeholder material;
    a second dielectric cap layer over the second dielectric layer;
    a patterned third dielectric layer over the second dielectric cap layer, the patterned third dielectric layer including an upper super via portion vertically aligned with the placeholder via, the placeholder via comprising a bottom super via portion, the bottom super via portion and the upper super via portion providing portions of a super via extending from the third dielectric layer to the first interconnect layer.

2. The interconnect structure of claim 1, wherein the sacrificial placeholder material comprises an organic planarization layer.

3. The interconnect structure of 1, wherein the sacrificial placeholder material comprises titanium nitride or tungsten.

4. The interconnect structure of claim 1, wherein the placeholder via extends through the second cap layer.

5. The interconnect structure of claim 1, wherein the second dielectric cap layer covers the sacrificial placeholder material within the placeholder via.

* * * * *